United States Patent
Yuan et al.

(12) 
(10) Patent No.: US 6,509,574 B2
(45) Date of Patent: Jan. 21, 2003

(54) OPTOCOUPLERS HAVING INTEGRATED ORGANIC LIGHT-EMITTING DIODES

(75) Inventors: Han-Tzong Yuan, Dallas, TX (US); Tae S. Kim, Dallas, TX (US); Simon J. Jacobs, Lucas, TX (US); Francis G. Celii, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 09/728,155

(22) Filed: Dec. 4, 2000

(65) Prior Publication Data

US 2002/0027206 A1 Mar. 7, 2002

(51) Int. Cl.$^7$ ............................................... G02B 27/00
(52) U.S. Cl. ..................... 250/551; 250/214.1; 257/444; 313/507; 438/609
(58) Field of Search ............................ 250/551, 214.1, 250/208.1; 257/444, 432, 290; 313/506, 504, 507; 438/65, 98, 608, 609

(56) References Cited

U.S. PATENT DOCUMENTS 5,117,102 A * 5/1992 Mitchell ...................... 250/221
6,274,979 B1 * 8/2001 Celii et al. ................... 313/498

OTHER PUBLICATIONS

Kim, Lasers and Electro–Optics Society Annual Meeting, 1995. 8th Annual Meeting Conference Proceedings, vol. 1., IEEE, vol: 2, 1995.*

* cited by examiner

Primary Examiner—Stephone B. Allen
Assistant Examiner—Bradford Hill
(74) Attorney, Agent, or Firm—Frederick J. Telecky, Jr.; W. James Brady, III

(57) ABSTRACT

An optocoupler structure comprising a semiconductor chip having an integrated circuit and an optically transparent, electrically insulating layer having first and second surfaces; an organic diode integral with said first surface, said diode operable to emit electromagnetic radiation; and said circuit including a radiation-sensitive semiconductor device integral with said second surface, electrically isolated from said diode, and positioned in the path of said radiation.

14 Claims, 2 Drawing Sheets

OPTOCOUPLERS HAVING INTEGRATED ORGANIC LIGHT-EMITTING DIODES

FIELD OF THE INVENTION

The present invention is related in general to the field of semiconductor devices and processes and more specifically to the use of organic light-emitting diodes for optocouplers.

DESCRIPTION OF THE RELATED ART

Commercial light emitting diodes (LEDs) typically constitute a p-n junction of inorganic, doped semiconducting materials such as gallium arsenide (GaAs) or aluminum gallium arsenide (AlGaAs). At these junctions between the doped layers, recombination of electrons and holes results in interband emission of light.

Heteroepitaxial growth of direct bandgap III-V compound semiconductors such as GaAs, InP, and GaP on silicon substrates, from which LEDs can be fabricated, yields highly defective material due to mismatches in lattice parameters and thermal expansion coefficients. These LEDs do not perform well, and the silicon circuits are affected during the heteroepitaxy due to the required high growth temperatures (typically>600° C.). Further, achieving good electrical isolation is not easy in these approaches.

As an alternative, III-V LEDs have been integrated with a silicon drive circuit at the package level; for instance, see U.S. Pat. No. 5,159,700, issued Oct. 27, 1992 (Reid, deceased et al., "Substrate with Optical Communication Systems between Chips Mounted thereon and Monolithic Integration of Optical I/O on Silicon Substrates"), based on U.S. Pat. No. 5,009,476, issued Apr. 23, 1991 (Reid et al., "Semiconductor Layer with Optical Communication between Chips Disposed therein"). But these approaches are expensive and not suitable for wafer-level integration.

Recently, organic light-emitting diodes (OLEDs) have drawn much attention, especially for emissive display applications. Since OLEDs can be fabricated on any smooth surface, such as silicon wafers, and at low (<100° C.) temperatures, they are also very promising for many optoelectronic applications. Electroluminescent devices have been constructed using multi-layer organic films. Basic structure and working are described in "Electroluminescence of Doped Organic Thin Films" (J. Appl. Phys., vol. 65, pp. 3610–3616, 1989) by C. W. Tang, S. A. VanSlyke, and C. H. Chen. The review article "Status of and Prospects for Organic Electroluminescence" (J. Materials Res., vol. 11, pp. 3174–3187. December 1996, by L. J. Rothberg and A. J. Lovinger) describes various OLED device structures in the form of stacks of thin layers with carrier injection and transverse current flow. For example, the stack may be a transparent substrate (for instance, glass), a transparent anode (for instance, indium-tin oxide, ITO), a hole transport layer (for instance, TPD), an emissive layer which also is an electron transport layer and in which electron-hole recombination and luminescence occur (for instance, Alq3), and a cathode (a metal with low work function, for instance, magnesium or a magnesium-containing alloy such as Mg:Ag). "TPD" is N,N'-diphenyl-N,N'-bis(3-methylphenyl)-1,1'biphenyl-4,4'diamine. "Alq3" is tris(8-hydroxy) quinoline aluminum.

A different approach using siloxane self-assembly techniques, has been described in U.S. Pat. No. 5,834,100, issued on Nov. 10, 1998 (Marks et al., "Organic Light-Emitting Diodes and Method for Assembly and Emission Control").

In addition to the OLEDs, many related devices such as organic laser diodes, photodetectors, etc. may be realized using organic semiconductors. For many applications such as on-chip interconnects, laser diodes are preferred over LEDs. Laser action has been demonstrated in polymeric organic films, but only by employing optical pumping (for instance, "Laser Emission from Solutions and Films Containing Semiconducting Polymer and Titanium Dioxide Nanocrystals", Chem. Phys. Lett., vol. 256, pp. 424–430, 1996, by F. Hide, B. J. Schwartz, M. A. Diaz-Garcia, and A. J. Heeger; "Lasing from Conjugated-Polymer Microcavities", Nature, vol. 382, pp. 695–697, by N. Tessler, G. J. Denton, and R. H. Friend; "Semiconducting Polymers: a New Class of Solid-State Laser Materials", Science, vol. 273, pp. 1833–1836, 1996, by F. Hide, M. A. Diaz-Garcia, B. J. Schwartz, M. R. Andersson, Q. Pei, and A. J. Heeger). Inadequate charge injection is the main roadblock in achieving an organic-based solid-state laser from electrically pumped organic films. The optical linking of OLEDs with light-sensitive devices has been described in U.S. Pat. No. 5,907,160, issued May 25, 1999 (Wilson et al., "Tin Film Organic Light Emitting Diode with Edge Emitter Waveguide").

In their paper "Enhanced Electron Injection in Organic Electroluminescence Devices using an Al/LiF Electrode" (Appl. Phys. Lett., vol. 70, pp. 152–154, 1997), L. S. Hung, C. W. Tang, and M. G. Mason disclose the beneficial effects of inserting an inorganic dielectric layer (LiF, thin enough for electron tunneling, 0.5 to 1.0 nm) between the metal cathode (Al) and organic material. The energy bands of Alq3 are bent downwards by the contact with LiF, thus substantially lowering the electronic barrier height of the Alq3-Al interfaces and enhancing the electron injection. The operating voltage is reduced and cathode metals of higher work function can be used. Further, the devices employ a thin (15 nm) buffer layer at the anode (ITO), comprised of CuPc (copper phthalocyanine). The hole transport layer is NPB (N,N'-bis(1-naphthyl)-N,N'-diphenyl-1,1'-biphenyl-4,4'-diamine). Alq3 is the emissive as well as electron transport layer.

Methods for fabrication and characterization (such as film thickness, and light intensity and wavelength) have been described in "Characterization of Organic Thin Films for OLEDs using Spectroscopic Ellipsometry" (F. G. Celii, T. B. Harton, and O. F. Phillips, J. Electronic Materials, vol. 26, pp. 366–371, 1997). The organic materials may be amorphous or polycrystalline discrete molecular, or may be polymeric. Polymer layers differ from discrete molecular layers because they are typically not fabricated by vacuum vapor deposition, but rather by spin coating from an appropriate solvent. The polymeric layers may also be deposited (either by vapor deposition or by spin coating) as pre-polymer layers and then converted either thermally or photochemically to the active form. Spin coating, spin casting, or melt techniques have the advantage of large area coverage and low fabrication cost.

The state of the art has been advanced by three recent patent applications to which the present invention is related. In U.S. patent application Ser. No. 09/156,166, filed on Sep. 17, 1998 (Celii et al., "Organic Light Emitting Diodes"), an OLED is provided with dielectric barriers at both the anode-organic and cathode-organic interfaces. Increased carrier injection efficiencies and increased overall OLED efficiency plus lower voltage operation are thus enabled. The subsequent U.S. patent application Ser. No. 60/165,060, filed on Nov. 12, 1999 (Jacobs et al., "Structure and Method of Electrically-Pumped Organic Laser Diodes using Charge- Injection Layers") applies the high injection efficiency to organic lasers. The further U.S. patent application (TI-26315, Kim et al., "Photo-lithographic Method for Fabricating Organic Light-Emitting Diodes") introduces mass-production techniques, compatible with silicon technology, to OLED fabrication.

A challenge has therefore arisen to conceive structures and fabrication methods for optocouplers having integrated organic light-emitting diodes suitable for miniaturization and high process yield. Preferably, this concept should be based on fundamental design solutions flexible enough to be applied for different diode, laser and integrated circuit product families and a wide spectrum of material and assembly variations. Manufacturing should be low cost and the devices stable and reliable. Preferably, the innovations should be accomplished using established fabrication techniques and the installed equipment base.

SUMMARY OF THE INVENTION

According to the present invention, an optocoupler is created by an integrated circuit which includes an optically transparent, electrically insulating surface, an organic light-emitting diode (OLED) formed on that surface, and a light-absorbing device embedded in the circuit yet electrically isolated from the diode.

It is an aspect of the present invention to fabricate efficient OLEDs using methods compatible with silicon technology and mass production, and integrate the diodes with photodetector integrated circuits.

Another aspect of the invention is to achieve electrical isolation between the light sources and the light-activated devices by an optically transparent, yet electrically insulating surface layer of the semiconductor wafer.

Another aspect of the invention is to select the photo-detecting devices from a group consisting of photodiodes coupled to amplifiers, phototransistors, and photodarlingtons.

Another aspect of the invention is to fabricate the optocouplers in wafer form and separate the wafer after completion of the fabrication process into discrete units; the units may be individual chips or optocoupler arrays.

In the first embodiment of the invention, the transparent and insulating surface of the wafer is an overcoat layer made of a material selected from a group consisting of silicon nitride, silicon dioxide, and silicon oxynitride.

In the second embodiment of the invention, the transparent and insulating surface of the wafer is a sheet-like glass.

Several variations of structures and process steps are described. Electrical and optical parameters are discussed. By way of example, an optocoupler based on an OLED and p-i-n diode/amplifier integrated circuit is described in detail.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
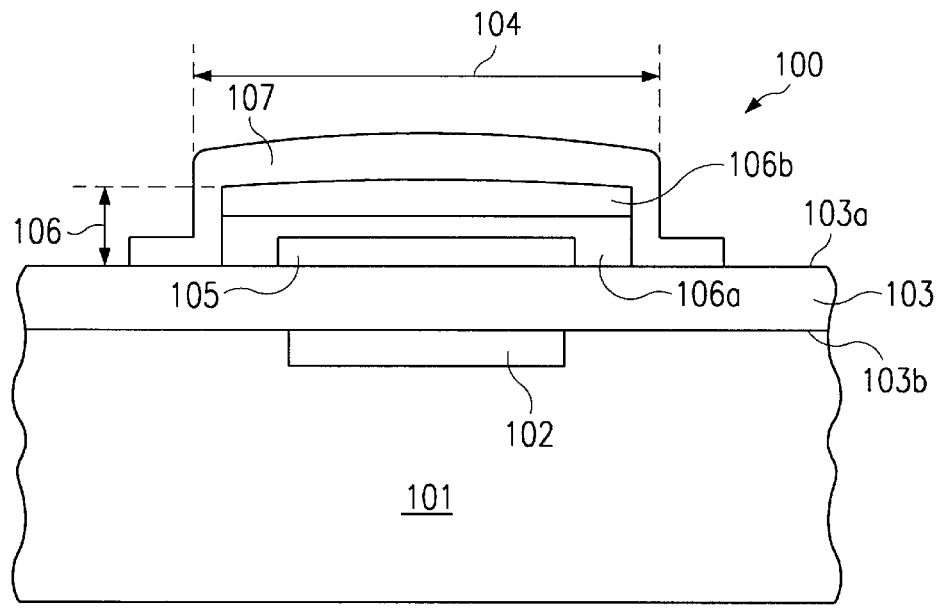
FIG. 1 is a schematic and simplified cross section of an optocoupler including an OLED and a photodetector according to the invention.

An optocoupler, or optoisolator, is a coupling device in which a light-emitting diode, energized by the input signal, is optically coupled to a photodetector, such as a light-sensitive output diode, transistor, or silicon-controlled rectifier. In FIG. 1, the optocoupler according to the invention, generally designated 100, is constructed on a semiconductor substrate 101. The semiconductor material can be silicon, silicon germanium, gallium arsenide or any other semiconducting material used in photolithographic manufacturing. Integral to substrate 101 is an integrated circuit (not shown in FIG. 1) and a semiconductor device 102 sensitive to electromagnetic radiation in a certain wavelength range. The radiation-sensitive device 102 is frequently referred to as photodetector.

Laying over photodetector 102 is a flat portion of an optically transparent, electrically insulating layer 103, which has first surface 103a and second surface 103b. The radiation-sensitive device 102 is integral with second surface 103b, and the organic diode 104, operable to emit electromagnetic radiation, is integral with the first surface 103a. The radiation-emitting diode is commonly referred to as OLED (organic light-emitting diode). Consequently, photodetector 102 is electrically isolated from OLED 104 and positioned in the path of the emitted radiation.

In the first embodiment of the present invention, layer 103 consists of one or more overcoat layers made of silicon nitride, silicon dioxide, or silicon oxynitride. Silicon nitride is. a material widely used in silicon technology for its moisture-impenetrable characteristic; in this invention, the layer is typically 0.8 to 1.2 $\mu$m thick. The isolating characteristic of layer 103 is needed, for example, when one side of the circuit operates in an electrically very noisy environment or uses a high voltage. Electrical isolation then provides safety for the delicate circuit side from strong electrical noise or high voltage.

In the second embodiment of the present invention, transparent and insulating layer 103 consists of sheet-like glass, which has a flat and smooth portion at least in the region of devices 102 and 104. Alternatively, layer 103 may be made of a glass-like inorganic material or polymeric material transparent for the electromagnetic radiation of OLED 104. In the case of glass ($SiO_2$), the dielectric strength is approximately 10E7 V/cm. Consequently, a 1.0 $\mu$m thick $SiO_2$ layer is enough to give 1000 V isolation and protection.

The organic radiation-emitting diode 104 consists of a stack of layers, deposited and structured in sequence, preferably at temperatures<100° C. The first layer is anode layer 105, preferably made of transparent ITO (indium-tin oxide) in the thickness range from about 100 to 150 nm. Alternatively, a very thin (approximately 5 nm) semitransparent gold film may be used.

Anode layer 105 is followed by one or more organic layers 106. In FIG. 1, these layers provide a layer 106a for hole transport, made of TPD in the thickness range from about 15 to 30 nm. For some material combinations, layer 106a may be between 40 and 50 nm thick. Alternatively, hole transport layer 106a is made of PPV (polyparaphenylene-vinylene), between about 20 and 30 nm thick.

Organic layer 106a is followed by organic layer 106b, which provides the light emission and the electron transport. Layer 106b is preferably made of undoped Alq3 in the thickness range from about 55 to 80 nm. For some optical applications, emissive Alq3 layer 106b may comprise dopants for achieving the desired light intensity at the preferred wavelength (i.e., for changing the color of the emitted radiation). The dopant may be a dye such as QAC (quinacridone) or DCM (4-(dicyanomethylene)-2-methyl-6-(4-dimethylaminostyryl)-4H-pyran). The dye dopant may be evaporated concurrently with the Alq3 to further increase efficiency; doping concentrations usually<5%. The QAC-doped emissive layer 106b provides green light, the DCM-doped layer yellow light.

Alternatively, emissive layer 106b is made of CN-PPV (cyano-substituted PPV), between about 70 and 80 nm thick.

Organic layers 106 are followed by cathode layer 107, preferably made of aluminum or magnesium-aluminum, about 150 to 250 nm thick. Alternative materials for cathode layer 107 are silver or aluminum-calcium mixtures. Layer 107 is electrically connected to receive input signals. Overall, OLED 104 may have an area of about 5 mm$^2$.

The processes used in the fabrication method for OLED 104 are described in more detail in the above-mentioned U.S. Patent Application TI-26315, to which the present invention is related. Overall, these processes are adaptable to miniaturization, compatible with silicon technology, and suitable for mass production.

Since the fabrication method described above lends itself to fabricating whole semiconductor wafers containing a plurality of units, the individual units have to be singulated from the wafer (typically by sawing or dicing) and packaged in order to form completed optocouplers. An array of optocouplers can also easily be achieved by sawing the completed wafer into arrays.

According to the present invention, the OLED 104 is designed and fabricated such that the OLED active area is aligned with the window of the radiation sensitive device 102; device 102 is thus in the path of the radiation from OLED 104.

It is an important aspect of the present invention that radiation-sensitive device 102 can be selected from a group consisting of a number of semiconductor devices, including a photodiode integrated with an amplifier circuit, a single phototransistor or a photodarlington. In schematic and simplified electrical diagrams, FIG. 2 illustrates an optocoupler using OLED 201 aligned to p-i-n diode 202, which is connected to amplifier 203, and an optically transparent, electrically insulating layer 204; the radiation 205 emitted by the OLED provides optical coupling to the p-i-n diode.

Figure 3:
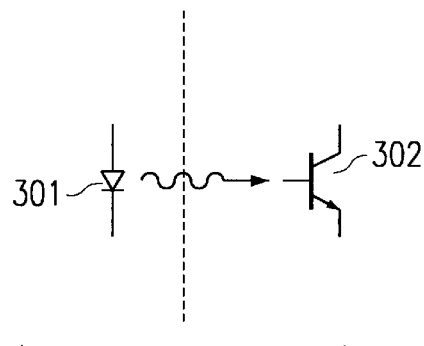
FIG. 3 is a schematic and simplified electrical diagram of an optocoupler including an OLED and a phototransistor.
Figure 4:
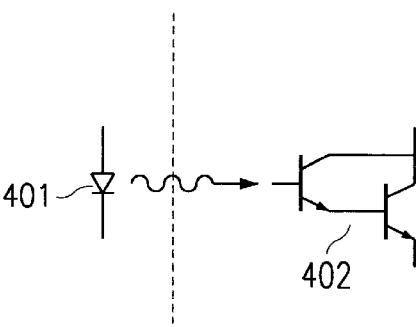
FIG. 4 is a schematic and simplified electrical diagram of an optocoupler including an OLED and a photodarlington.

FIG. 3 depicts an optocoupler using OLED 301 aligned with phototransistor 302. FIG. 4 shows an optocoupler using OLED 401 aligned with photodarlington 402.

Figure 2:
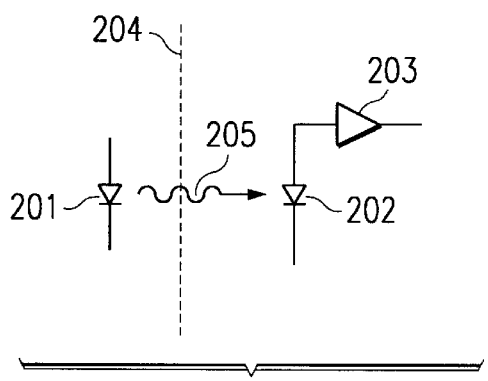
FIG. 2 is a schematic and simplified electrical diagram of an optocoupler including an OLED and a p-i-n diode.
Figures 5, 6:
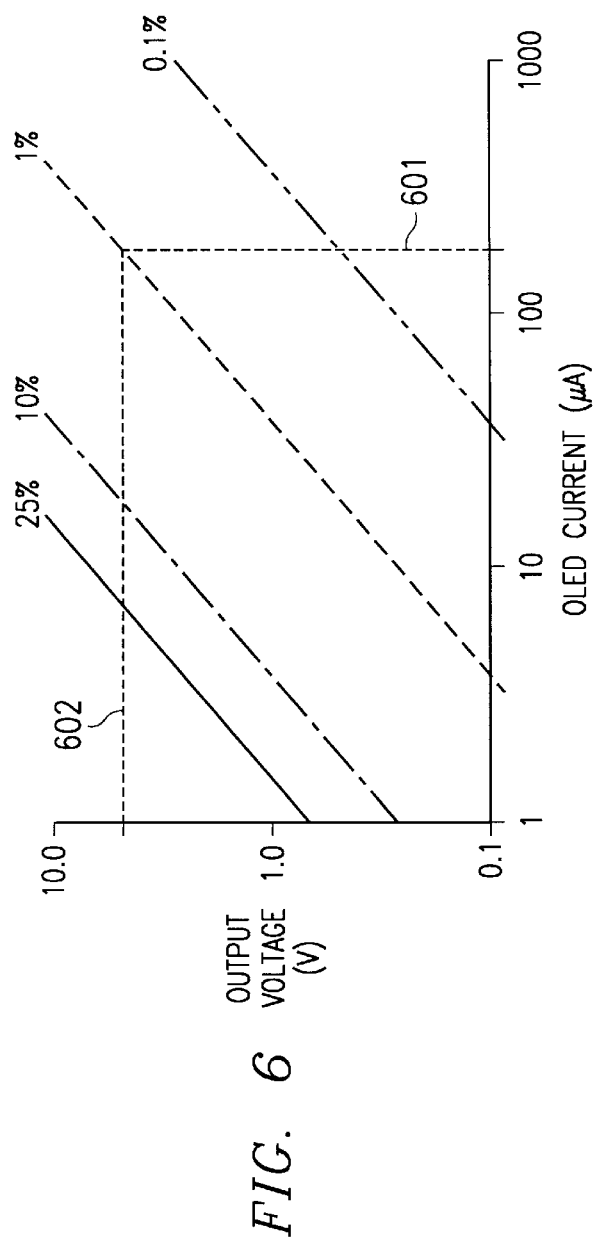
FIG. 5 is a table of key characteristics of a photodiode and a photodarlington, which are used in an embodiment of an optocoupler with integrated OLED according to the invention.
FIG. 6 displays characteristics of an optocoupler in the arrangement of FIG. 2. Photodiode output voltage is measured as a function of OLED current, with OLED internal quantum efficiency as parameter.

By way of example, FIGS. 5 and 6 describe in more detail some parameters and characteristics of an optocoupler based on an OLED and a p-i-n diode/amplifier (arrangement of FIG. 2). FIG. 5 lists in a table the key characteristics of a photodiode integrated with an amplifier (device TSL 250 fabricated by Texas Instruments Inc., Dallas, Tex., U.S.A.). Device TSL 250 is a light-to-voltage optical sensor, combining a photodiode and a transimpedance amplifier in a single monolithic integrated circuit. For comparison, the table of FIG. 5 also lists the characteristics of a photodarlington (device SLR-508 F3 fabricated by Silonex, 2150 Ward Avenue, Montreal, Quebec, Canada).

Since the OLED can be fabricated directly on the window of the p-i-n diode, a fairly high photon coupling efficiency (in the order of 20%) between the OLED and the p-i-n diode can be obtained. Based on a 20% light coupling efficiency, FIG. 6 plots (double logarithmic plot) the calculated characteristics of an optocoupler consisting of a TSL 250 and an OLED. The OLED current is measured in $\mu A$, and the photodiode output voltage in V. The OLED internal quantum efficiency is used as parameter. As shown in FIG. 6, an OLED current of 182 $\mu A$ (designated 601) is enough to generate a photodiode output voltage of 5 V (designated 602), for an OLED internal quantum efficiency of 1%. It should be noted that internal quantum efficiencies higher than 10% have been demonstrated using the process for OLED fabrication described above. In the example of FIG. 6, the switching speed of the OLED is not a limiting factor since the amplifier circuit has fairly long rise and fall times.

When considering other embodiments of the present invention, those skilled in the art remember that typically, phototransistors have a higher current conversion efficiency (i.e., ratio of output current to input current) than photodiodes. Thus, OLEDs can be integrated with phototransistors to form an optocoupler. Further, by integrating an OLED with a photodarlington, a current conversion efficiency of about 1.5 can be achieved for 1% OLED internal quantum efficiency and 20% coupling efficiency between OLED and phototransistor.

It should be noted that using a semitransparent thin gold film as the OLED anode instead of the transparent ITO (see the alternative process mentioned above) would reduce the coupling efficiency by at least about 50%.

In contrast to the integrated optocouplers of the present invention, the conventional optocouplers are assembled at the packaging level, using discrete light-emitting diodes and light-activated devices. Consequently, the presence of low refractive index material, such as air, between the OLED and the p-i-n diode substantially reduces the coupling efficiency due to the internal reflection of the radiation (light) generated inside the OLED. Also, the refractive index of OLEDs is better matched with SiO2 than that of conventional light emitting diodes (usually III-V compound semiconductor devices, such as GaAs, InP, GaP).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, instead of using a semiconductor substrate, the light-sensitive devices are fabricated on one side of a transparent, insulating substrate and the OLEDs are fabricated on the other side of the substrate. As another example, the OLEDs described may be modified for producing organic laser diodes by adding reflective surfaces surrounding a portion of the OLED, configured to provide a high-gain laser cavity. As another example, the fabrication processes described may be applied to OLEDs having an anode including a tunneling barrier at the interface with the hole transport layer for enhancing charge injection, and having a cathode including a tunneling barrier at the interface with the electron transport layer for enhancing charge injection. It is therefore intended that the appended claims encompass any such modifications or embodiments.

We claim:

1. An optocoupler structure comprising:

a semiconductor chip having an integrated circuit and an optically transparent, electrically insulating layer having first and second surfaces;

an organic diode integral with said first surface, said diode operable to emit electromagnetic radiation; and said circuit including a radiation-sensitive semiconductor device integral with said second surface, electrically isolated from said diode, and positioned in the path of said radiation.

2. The optocoupler according to claim 1 wherein said semiconductor chip is made of silicon, silicon germanium, gallium arsenide or any other semiconducting material used in photolithographic manufacturing.

3. The optocoupler according to claim 1 wherein said device is a photodiode integrated with an amplifier.

4. The optocoupler according to claim 1 wherein said device is a phototransistor.

5. The optocoupler according to claim 1 wherein said device is a photodarlington.

6. The optocoupler according to claim 1 wherein said transparent and insulting layer is one or more overcoat layers made of a material selected from a group consisting of silicon nitride, silicon dioxide and silicon oxynitride.

7. The optocoupler according to claim 1 wherein said transparent and insulating layer is a sheet-like glass.

8. The optocoupler according to claim 1 wherein said organic diode is an organic light-emitting diode or an organic laser diode.

9. A method for fabricating optocoupler structures on a semiconductor wafer, comprising the steps of:

forming a plurality of integrated circuits into said wafer, each of said circuits having a device operable to absorb electromagnetic radiation;

depositing an optically transparent, electrically insulating layer onto said wafer; and forming a plurality of organic diodes comprising doped Alq3 having indium-tin oxide anodes onto said layer, each of said diodes aligned with one of said devices, respectively, and operable to emit electromagnetic radiation directed toward said radiation-absorbing device.

10. The method according to claim 9 wherein said forming of said diode comprises the steps of:

depositing and forming said anodes on said insulating layer, said anodes being electrically conductive and optically transparent;

depositing and forming a layer of doped Alq3 on said electrode, capable of transporting electrons and holes and emitting electromagnetic radiation; and depositing and forming a second electrode on said Alq3 organic layer, configured to protect said organic layer.

11. A method as in claim 10 wherein said dopant comprises quinacridone or 4-(dicyanomethylene)-2-methyl-6-(4-dimethylaminostyryl-4H-pyran).

12. The method according to claim 9 further comprising the steps of:

separating the resulting composite wafer into discrete units; and assembling each of said units into a package, thereby completing the optocoupler fabrication.

13. The method according to claim 12 wherein said discrete unit is a chip.

14. The method according to claim 12 wherein said discrete unit is an array.

* * * * *

UNITED STATES PATENT AND TRADEMARK OFFICE
CERTIFICATE OF CORRECTION

PATENT NO.     : 6,509,574 B2
DATED          : January 21, 2003
INVENTOR(S)    : Han-Tzong Yuan et al.

It is certified that error appears in the above-identified patent and that said Letters Patent is hereby corrected as shown below:

<u>Title page,</u>
Item [60], under Related U.S. Application Data -- Provisional Application No. 60/168,528 December 2, 1999. --

Signed and Sealed this

Eleventh Day of March, 2003

JAMES E. ROGAN
*Director of the United States Patent and Trademark Office*